US009638765B2

(12) United States Patent
Kern et al.

(10) Patent No.: US 9,638,765 B2
(45) Date of Patent: May 2, 2017

(54) DEVICE AND METHOD FOR MONITORING SIGNAL LEVELS

(71) Applicant: Robert Bosch GmbH, Stuttgart (DE)

(72) Inventors: Robert Kern, Sinzheim (DE); Tobias Kiefer, Rheinmuenster (DE)

(73) Assignee: Robert Bosch GmbH, Stuttgart (DE)

( * ) Notice: Subject to any disclaimer, the term of this patent is extended or adjusted under 35 U.S.C. 154(b) by 566 days.

(21) Appl. No.: 14/105,264

(22) Filed: Dec. 13, 2013

(65) Prior Publication Data

US 2014/0172337 A1    Jun. 19, 2014

(30) Foreign Application Priority Data

Dec. 18, 2012 (DE) .................. 10 2012 223 581

(51) Int. Cl.

| | |
|---|---|
| *G01R 25/00* | (2006.01) |
| *G01R 19/00* | (2006.01) |
| *G01R 33/07* | (2006.01) |
| *G01D 5/14* | (2006.01) |

(52) U.S. Cl.
CPC ............. *G01R 33/07* (2013.01); *G01D 5/14* (2013.01); *G01D 5/142* (2013.01); *G01D 5/145* (2013.01)

(58) Field of Classification Search
CPC ...... G01D 5/14; G01D 5/24476; G01D 5/142; G01D 5/145; G01D 5/2448; F02D 41/009; G01R 33/07; G01K 13/00
USPC .............................................. 702/57, 64, 65
See application file for complete search history.

(56) References Cited

U.S. PATENT DOCUMENTS

| | | | |
|---|---|---|---|
| 7,302,357 B2* | 11/2007 | Ausserlechner | ........ H01L 23/34 257/427 |
| 2011/0270553 A1* | 11/2011 | Ausserlechner | ..... G01R 15/202 702/64 |

FOREIGN PATENT DOCUMENTS

DE   10 2007 031 385 A1    2/2008

* cited by examiner

*Primary Examiner* — An Do
(74) *Attorney, Agent, or Firm* — Maginot, Moore & Beck LLP

(57) ABSTRACT

A device for monitoring signal levels of signals that are generated, for the purpose of detecting a magnetic field, by a plurality of Hall sensors includes a first, second, and third input and a diagnostic device. The first input is configured to receive a first signal from a first Hall sensor. A first electrical resistor is connected between the first input and a central point. The second input is configured to receive a second signal from a second Hall sensor. A second electrical resistor is connected between the second input and the central point. The third input is configured to receive a third signal from a third Hall sensor. A third electrical resistor is connected between the third input and the central point. The diagnostic device is connected to the central point and is configured to determine a position of the detected magnetic field using an average value.

3 Claims, 4 Drawing Sheets

DEVICE AND METHOD FOR MONITORING SIGNAL LEVELS

This application claims priority under 35 U.S.C. §119 to patent application no. DE 10 2012 223 581.7, filed on Dec. 18, 2012 in Germany, the disclosure of which is incorporated herein by reference in its entirety.

BACKGROUND

The present disclosure relates to a device for monitoring signal levels, to a method for monitoring signal levels and also to a corresponding computer program product.

A position of a magnetic field of a rotor can be taken into consideration in order to control the process of electronically commutating a DC motor. At least one Hall sensor can be used for determining the position.

DE 10 2007 031 385 A1 describes a method and a device for detecting a low voltage supply at least of one Hall sensor.

SUMMARY

On the basis of this background, the present disclosure discloses a device for monitoring signal levels of signals that are generated, for the purpose of detecting a magnetic field, by means of Hall sensors; the disclosure further discloses a method for monitoring signal levels of signals that are generated, for the purpose of detecting a magnetic field, by means of Hall sensors, and finally, the disclosure discloses a corresponding computer program product in accordance with the independent claims. Advantageous embodiments are evident from the respective dependent claims and the description hereinunder.

In addition to monitoring a supply voltage of the Hall sensors, it is possible to determine a position and/or an orientation of the magnetic field by way of an individual channel by means of using electrical resistors in a monitoring device for Hall sensors. As a consequence, separate input channels are no longer necessary for determining the position and consequently a cost effective component can be used.

The disclosure discloses a device for monitoring signal levels of signals that are generated, for the purpose of detecting a magnetic field, by means of Hall sensors, wherein the device comprises at least the following features:
  (i) a first input for a first signal from a first Hall sensor, wherein a first electrical resistor is connected between the first input and a central point,
  (ii) a second input for a second signal from a second Hall sensor, wherein a second electrical resistor is connected between the second input and the central point,
  (iii) a third input for a third signal from a third Hall sensor, wherein a third electrical resistor is connected between the third input and the central point, and
  (iv) a diagnostic device that is connected to the central point and embodied for the purpose of determining a position and/or an orientation of the detected magnetic field using an average value that results from the first, second and third signal.

In addition, the disclosure discloses a method for monitoring signal levels of signals that are generated, for the purpose of detecting a magnetic field, by means of Hall sensors, wherein the method comprises at least the following steps:
  (i) reducing a first signal level of a first signal from a first Hall sensor at a first electrical resistor in order to obtain a first reduced signal level,
  (ii) reducing a second signal level of a second signal from a second Hall sensor at a second electrical resistor in order to obtain a second reduced signal level,
  (iii) reducing a third signal level of a third signal from a third Hall sensor at a third electrical resistor in order to obtain a third reduced signal level,
  (iv) providing an average value of the reduced signal levels at a central point, and
  (v) detecting an electrical malfunction of the Hall sensors and/or a position and/or an orientation of the detected magnetic field using the average value.

The method can comprise at least one additional reduction step, in which at least one additional signal level of an additional signal from an additional Hall sensor is reduced at an additional electrical resistor in order to obtain an additional reduced signal level.

The term "a signal from a Hall sensor" can be understood to mean an electrical signal. The signal can represent information regarding the strength of a magnetic flux of a magnetic field at the Hall sensor. The signal can be provided in an analogue or binary format. If the signal is provided in a binary format, the signal can represent whether the magnetic flux at the Hall sensor is greater than or less than a threshold value. The binary signal can be affected by hysteresis. As a result of the hysteresis, in the case of an increasing magnetic flux, the threshold value can differ from the threshold value in the case of a decreasing magnetic flux. The binary signal can be an electrical voltage in a signal line. Two signal levels that differ from one another can represent the two signal states. The signal level can be reduced at an electrical resistor. The term "a position" can be understood to mean a position (by way of example spatial) or alignment of the magnetic field. The term "an orientation" can be understood to mean a direction of field vectors of the magnetic field. An average value can be a sum of several reduced signal levels, by way of example, said reduced signal levels can form the arithmetic average of the signal level under consideration. It is possible using the diagnostic device to conclude (or determine) a position of the magnetic field based on a level of the average value, since the magnetic flux at the Hall sensors is different in each position of the magnetic field.

The second resistor can comprise a first ratio with respect to the first resistor. The third resistor can comprise a second ratio with respect to the first resistor. The first ratio and the second ratio can differ from one another. The first ratio and the second ratio can be predetermined in a fixed manner. In particular, the second resistor can be twice as large as the first resistor. The third resistor can be four times as large as the first resistor. Alternatively, the third resistor can also be three times as large as the first resistor. As a result of the graded resistor values, signal levels that are used to obtain the average value differ (by way of example can differ) from those signals that are to be expected in the case of different possible combinations of signals. Since different combinations of the signals regularly recur in different positions of the magnetic field, it is possible to draw conclusions from the signal level of the average value regarding the position, alignment or orientation of the magnetic field.

The device can comprise at least one additional input for an additional signal from an additional Hall sensor, wherein an additional electrical resistor is connected between the additional input and the central point. The magnetic field can be detected using more than three Hall sensors. A greater number of Hall sensors render it possible to measure an increased angular accuracy. In particular, the magnetic field can be detected using five Hall sensors. The Hall sensors can be arranged in a regular manner around the magnetic field.

The at least one additional resistor can comprise an additional ratio with respect to the first resistor. The additional ratio can differ from the first ratio and the second ratio. The additional ratio can be predetermined in a fixed manner. In particular, the additional resistor can be six times as large as the first resistor. The signal level can comprise at least one additional characteristic value as a result of the ratio that is predetermined in a fixed manner, which characteristic value can be clearly assigned to the position, the alignment and/or the orientation of the magnetic field.

In addition, the diagnostic device can be embodied for the purpose of detecting an electrical malfunction of the Hall sensors if the average value deviates by more than a tolerance range of an expected average value or a temporal progression of the average value. An expected progression can comprise at least two target values that are to be achieved within a predetermined time span. If the average value deviates from the progression, then that can, by way of example, represent a malfunction in the case of a supply voltage at least of one Hall sensor. A deviation can likewise represent an interruption at least of a signal line or the failure of a Hall sensor. The diagnostic device can be embodied for the purpose of providing an error message if an electrical malfunction is detected. The malfunction can then be promptly remedied.

The disclosure also advantageously discloses a computer program product having program code that can be saved to a machine readable medium such as a semiconductor memory, a hard-disk storage device or an optical storage device and if the program product is implemented on a computer or a device, said computer program is used to perform the method in accordance with one of the previously described embodiments.

BRIEF DESCRIPTION OF THE DRAWINGS

The disclosure is further described hereinunder in an exemplary manner with reference to the attached drawings. In the drawings.

DETAILED DESCRIPTION

Figure 1:
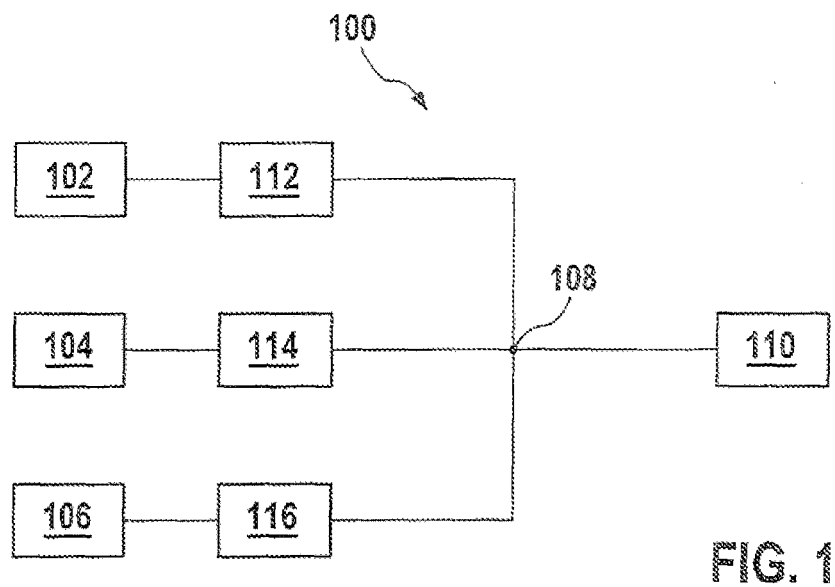
FIG. 1 illustrates a block diagram of a device for monitoring signal levels in accordance with an exemplary embodiment of the present disclosure.

In the description hereinunder of preferred exemplary embodiments of the present disclosure, like or similar reference numerals are used for elements that are illustrated in the different figures and function in a similar manner; the description of these elements is not repeated.

FIG. 1 illustrates a block diagram of a device 100 for monitoring signal levels in accordance with an exemplary embodiment of the present disclosure. The device 100 is embodied for the purpose of monitoring signal levels of signals that are generated, for the purpose of detecting a magnetic field, by means of Hall sensors. The device 100 comprises a first input 102, a second input 104, a third input 106, a central point 108 and a diagnostic device 110. The first input 102 is embodied for the purpose of receiving a first signal from a first Hall sensor. A first electrical resistor 112 is connected between the first input 102 and the central point 108. The second input 104 is embodied for the purpose of receiving a second signal from a second Hall sensor. A second electrical resistor 114 is connected between the second input 104 and the central point 108. The third input 106 is embodied for the purpose of receiving a third signal from a third Hall sensor. A third electrical resistor 116 is connected between the third input 106 and the central point 108. The diagnostic device 110 is connected to the central point 108. The diagnostic device 110 is embodied for the purpose of determining a position of the detected magnetic field, by using an average value that results from the first, second and third signal.

Figure 2:
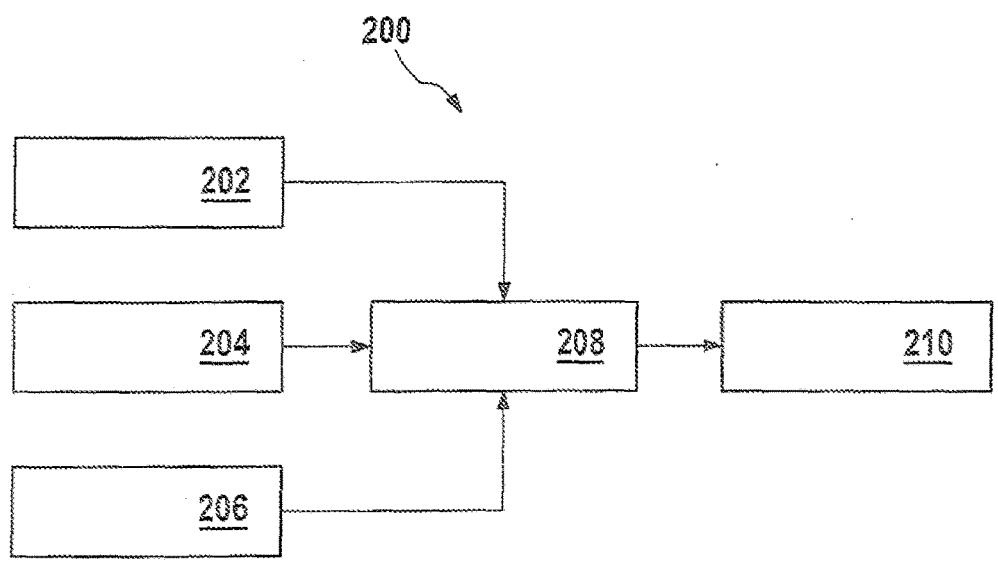
FIG. 2 illustrates a flow diagram of a method for monitoring signal levels in accordance with one exemplary embodiment of the present disclosure.

FIG. 2 illustrates a flow diagram of a method 200 for monitoring signal levels in accordance with an exemplary embodiment of the present disclosure. The method 200 is used to monitor signal levels of signals that are generated, for the purpose of detecting a magnetic field, by means of Hall sensors. The method 200 comprises a first reduction step 202, a second reduction step 204, a third reduction step 206, a providing step 208 and a determining step 210. In the first reduction step 202, a first signal level of a first signal from a first Hall sensor is reduced at a first electrical resistor in order to obtain a first reduced signal level. In the second reduction step 204, a second signal level of a second signal from a second Hall sensor is reduced at a second electrical resistor in order to obtain a second reduced signal level. In the third reduction step 206, a third signal level of a third signal from a third Hall sensor is reduced at a third electrical resistor in order to obtain a third reduced signal level. In the providing step 208, an average value of the reduced signal levels is provided at a central point. In the determining step 210, an electrical malfunction of the Hall sensors is detected using the average value and/or a position of the detected magnetic field is determined using the average value.

Figure 3:
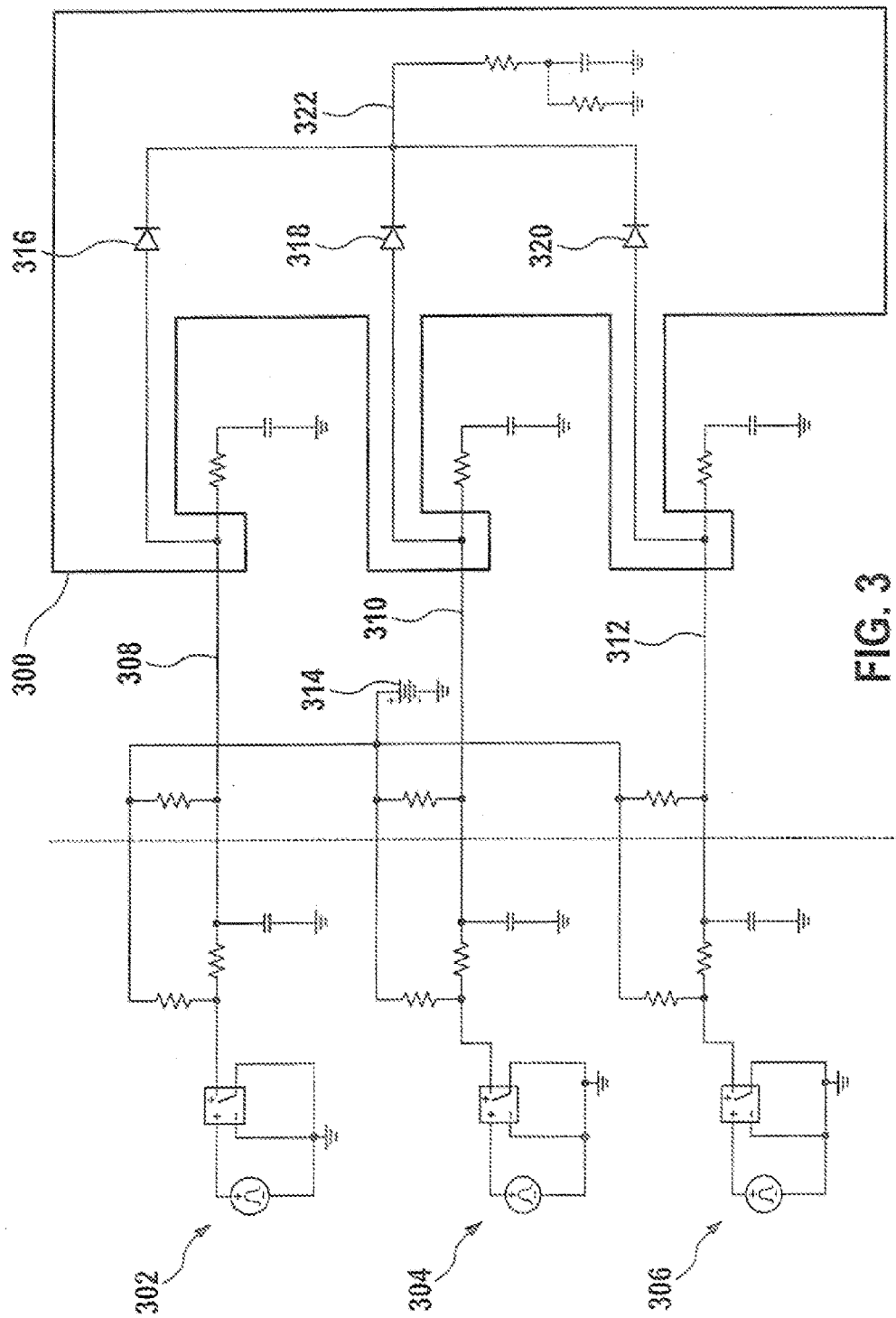
FIG. 3 illustrates a circuit diagram of a signal monitoring arrangement for signals from Hall sensors.

FIG. 3 illustrates a circuit diagram of a signal monitoring arrangement 300 for signals from three Hall sensors 302, 304, 306. The signal monitoring arrangement 300 is connected to the Hall sensors 302, 304, 306 by way of signal lines 308, 310, 312. The Hall sensors 302, 304, 306 are embodied for the purpose of providing binary signals. The Hall sensors 302, 304, 306 are supplied with a supply voltage by a voltage supply 314. The signal lines 308, 310, 312 are connected in the signal monitoring arrangement 300 by way of diodes 316, 318, 320 to a voltage divider as a common output 322. The diodes 316, 318, 320 block a signal from the Hall sensors 302, 304, 306 as long as the signal comprises a lower voltage than a blocking voltage of the diodes 316, 318, 320. The blocking voltage is lower than the supply voltage.

In the case of controlling electric motors, both direct current motors and also electronically commutated (EC) motors, Hall sensors can be used for the purpose of determining the position of the rotor. In the case of EC-motors, sufficient accuracy can be achieved by using three Hall signal lines per motor. This determines the position of the rotor within one electrical rotation by way of a digital signal pattern. In the case of three Hall signals, an electrical resolution of 60° occurs within which a Hall signal bit pattern remains constant. In addition to the digital evaluation within an electronic control unit (ECU) for determining the position, these signals can be logically combined (OR-operation by way of diodes 316, 318, 320) in order to render it possible to diagnose an analogue signal from a Hall sensor. In this type of circuit arrangement 300 it is possible to diagnose, whether or not the supply voltage of the Hall signals lies within a plausible range.

Figure 4:
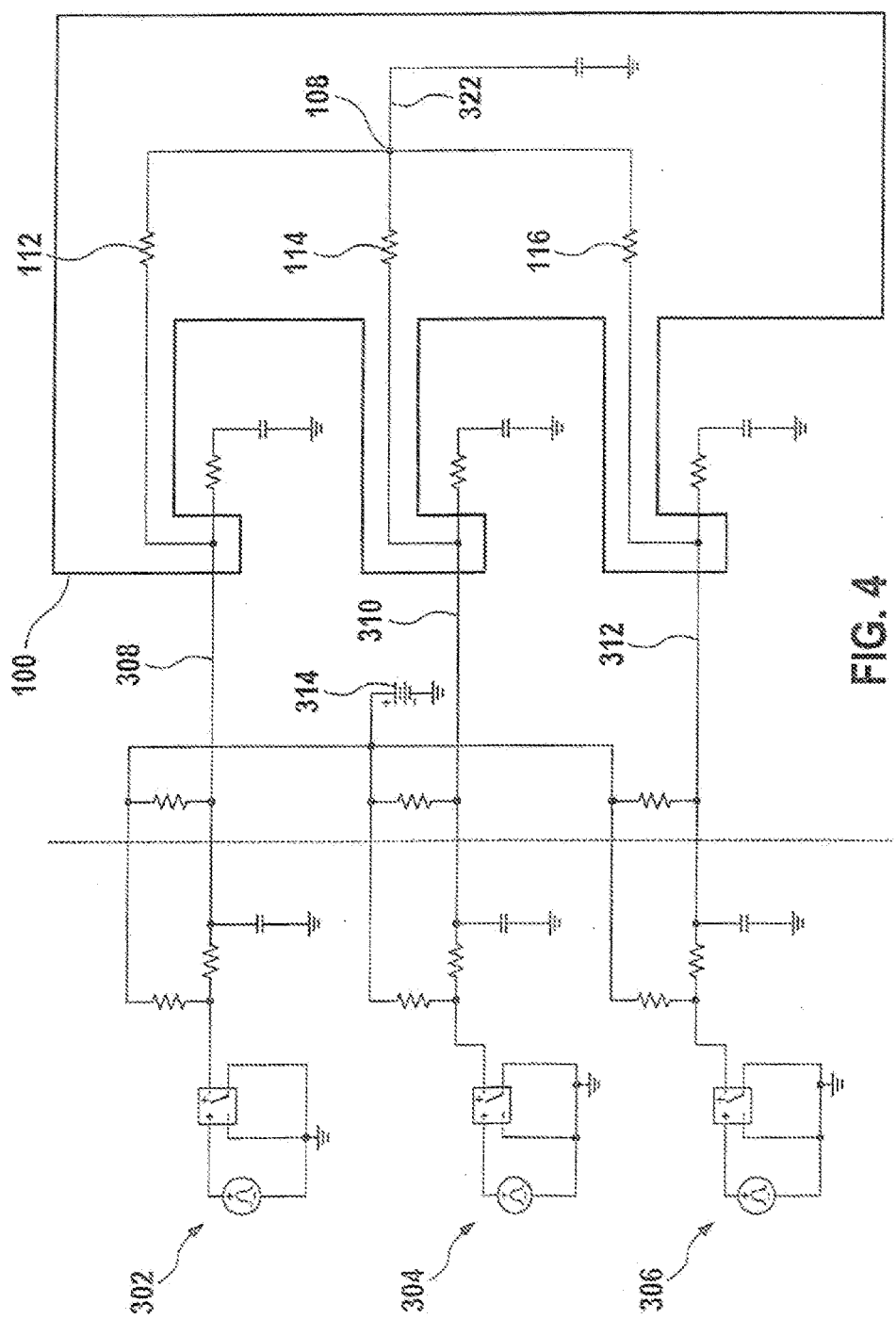
FIG. 4 illustrates a circuit diagram of a device for monitoring signal levels from Hall sensors in accordance with an exemplary embodiment of the present disclosure.

FIG. 4 illustrates a circuit diagram of part of a device 100 for monitoring signal levels from Hall sensors 302, 304, 306 in accordance with an exemplary embodiment of the present disclosure. The Hall sensors 302, 304, 306 and signal lines 308, 310, 312 correspond to the illustration in FIG. 3. In contrast to FIG. 3, the signal lines 308, 310, 312 are connected to a common output 322 by way of resistors 112, 114, 116 by way of a central point 108. In this exemplary embodiment, the resistors 112, 114, 116 comprise different resistance values. The second resistor 114 is twice as large as the first resistor 112. The third resistor 116 is four times as large as the first resistor 112. A diagnostic device that is connected to the output 322 is not illustrated in this figure.

As a result of the disclosed method, the options for the diagnosis process whilst retaining the use of one analogue measurement channel per motor is increased by means of adjusting accordingly the manner in which the Hall signals are combined, consequently more complex diagnostic options can be made available.

In the disclosed method, a resistor network 112, 114, 116 where the resistors have a particular ratio with respect to one another is used for the purpose of combining the Hall position signals. As a consequence, in addition to the sensor supply voltage diagnosis it is also possible to perform a position diagnosis, since a fixed analogue voltage value is allocated to each of the six bit pattern states by means of the circuitry having the resistors 112, 114, 116. In the case of less demand being placed on the commutation accuracy (for example in the case of a motor having a low rotation speed) it is no longer necessary to digitally import the three digital signals and in lieu thereof only the analogue signals can be imported using the disclosed special resistor network 112, 114, 116. As a consequence, the number of computer input ports can be reduced and it renders possible smaller and more cost-effective derivatives.

The diagnosis options can be considerably increased by means of replacing the diodes in FIG. 3 with the resistors 112, 114, 116, which are in ratio R, 2*R, 4*R with respect to one another and by means of removing the voltage divider at the analogue input 322 that is illustrated in FIG. 3.

Figure 5:
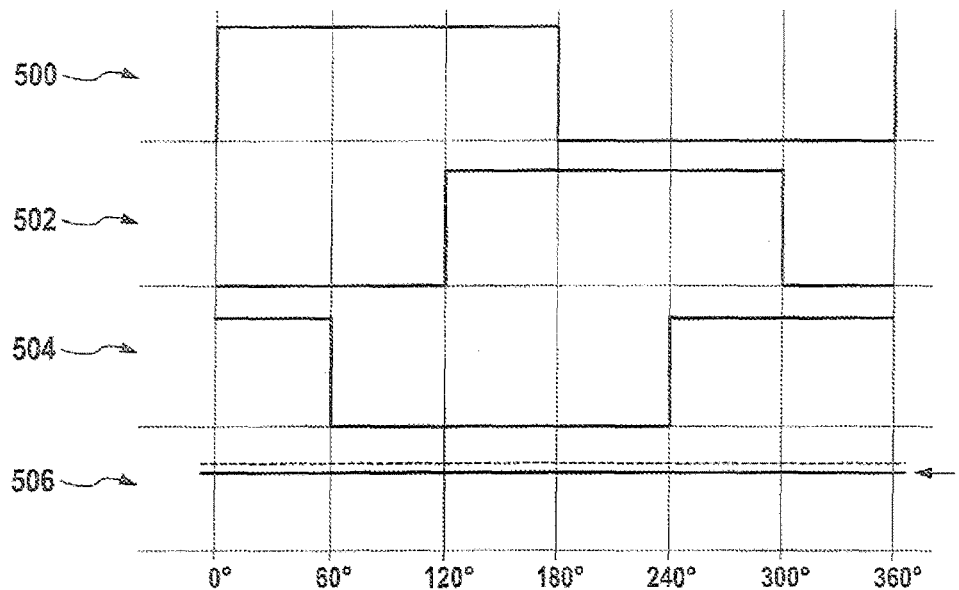
FIG. 5 illustrates a signal progression chart of signals from Hall sensors.

FIG. 5 illustrates a signal progression chart of signals 500, 502, 504 from Hall sensors. The signals 500, 502, 504 are binary signals that can assume two states. The signals 500, 502, 504 can comprise a lower signal level in a first state and a high signal level in a second state. In this exemplary embodiment, the low signal level is a ground potential and the high signal level is a supply voltage of the Hall sensors. A signal 500, 502, 504 of a Hall sensor comprises the low signal level if a magnetic flux at the Hall sensor is less than a threshold value. The signal 500, 502, 504 comprises the high signal level if the magnetic flux is greater than the threshold value. In this exemplary embodiment, a transition between the signal levels can represent an inversion of an algebraic sign of the magnetic flux at the Hall sensor. In the signal progression chart, the signals 500, 502, 504 are plotted over an angle of 360° or 2π. The angle describes an angular position of a rotor of an electric motor and therefore an angular position of a magnetic field that is rotating with the rotor, which magnetic field causes the magnetic flux. The signals 500, 502, 504 comprise in each case for 180° the low signal level and change to the high signal level for the subsequent 180°. The signals subsequently return to the low signal level for a subsequent rotation. The Hall sensors, in this case three examples thereof, are arranged in the electric motor with an angular displacement of 120° with respect to one another. The signals 500, 502, 504 therefore likewise comprise an angular displacement of 120° with respect to one another. It is evident from this, that one of the signals 500, 502, 504 undergoes a transition between the signal levels with each angular displacement of 60°. The level of accuracy when determining the angle is consequently limited in this exemplary embodiment to 60°. An insignificantly reduced signal level 506 of the supply voltage is plotted below the three signals 500, 502, 504, which signal level remains constant throughout the 360°. When using diodes for a monitoring process, as in FIG. 3, the signal 506 would be present at the output. For this purpose, the three Hall signal paths 500, 502, 504 are logically combined in the control device by way of three diodes and are determined by way of a subsequent voltage divider by way of an analogue input. The voltage 506 at the analogue input then corresponds to the Hall signal supply voltage minus the diode forward voltage. As a consequence, it renders it possible to determine whether the sensors are supplied with a low voltage, which can lead to a non-recognition of the individual Hall edges at the digital input of a computer.

Figure 6:
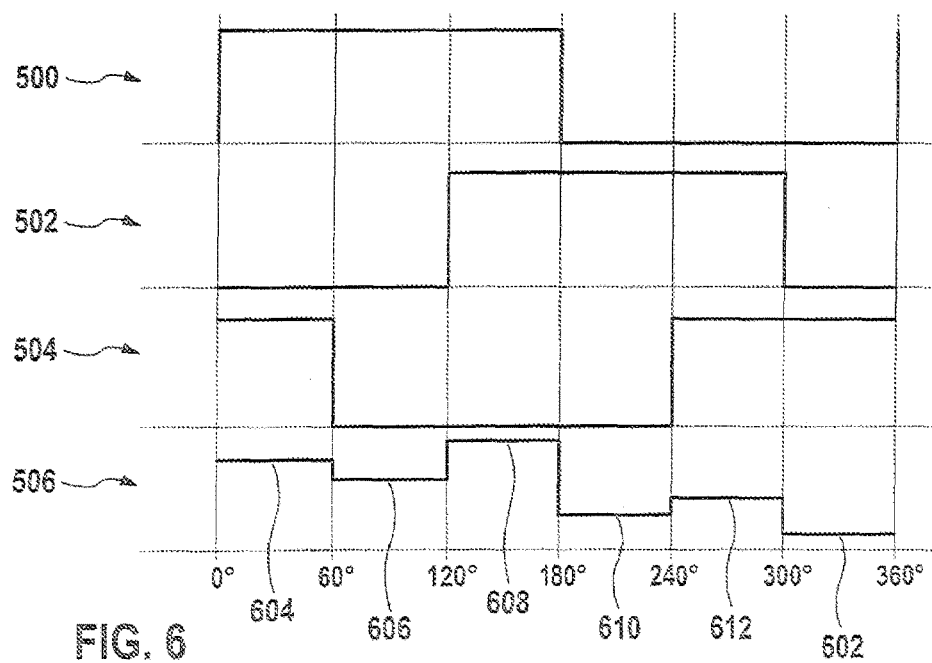
FIG. 6 illustrates a signal progression chart of signals from Hall sensors in accordance with an exemplary embodiment of the present disclosure.

FIG. 6 illustrates a signal progression chart of signals 500, 502, 504 from Hall sensors in accordance with an exemplary embodiment of the present disclosure. The signals of the Hall sensors correspond to the signals in FIG. 5. An output signal 600 of a device for the monitoring process in accordance with the method that is disclosed is illustrated below the signals 500, 502, 504. The output signal 600 comprises six different signal levels. The output signal 600 is formed by a combination of the signal levels of the three signals 500, 502, 504 that are reduced in each case using different resistors. In this exemplary embodiment, the first signal level of the first signal 500 is reduced using a first resistor R. The second signal level of the second signal 502 is reduced using a second resistor 2*R that is twice as large as the first resistor R. The third signal level of the third signal 504 is reduced using a third resistor 4*R that is four times as large as the first resistor R. A change in the signal level of the output signal 600 occurs in each case after 60° as a result of the angular displacement of 120° of the signals 500, 502, 504. Since in each case only one of the signals 500, 502, 504 changes, in the case of a defined angular position, a level that is determined by the resistors is added to the signal level of the output signal 600 in each case to the output signal 600 or subtracted from the output signal 600.

In this exemplary embodiment, the first signal 500 changes from the low signal level to the high signal level at zero degrees. The second signal 502 remains at the low signal level and the third signal 504 remains at the high signal level. As a consequence, the signal level of the output signal 600 increases from a lowest signal level 602, which results from the third signal 504, to a second highest signal level 604. The second highest signal level 604 results from a combination of the third signal 504 with the first signal 500. In the case of an angle of 60°, the third signal 504 changes from the high signal level to the low signal level. The first signal 500 remains at the high signal level and the second signal 502 remains at the low signal level. As a consequence, the signal level of the output signal 600 falls to a third highest signal level 606 that results solely from the first signal 500. In the case of an angle of 120°, the second signal 502 changes from the low signal level to the high signal level. The first signal 500 remains at the high signal level and the third signal 504 remains at the low signal level. As a consequence, the signal level of the output signal 600 increases to its highest signal level 608 that results from the first signal 500 and the second signal 502. In the case of 180°, the first signal 500 changes from the high signal level to the low signal level. The second signal 502 remains at the high signal level and the third signal 504 remains at the low signal level. As a consequence, the output signal 600 falls to a second lowest signal level 610 that results solely from the second signal 502. In the case of an angle of 240°, the third signal 504 changes to the high signal level. The first signal 500 remains at the low signal level and the second signal 502 remains at the high signal level. The signal level of the output signal 600 therefore increases to the third lowest signal level 612. In the case of 300°, the second signal level 502 changes from the high signal level to the low signal level. The first signal 500 remains at the low signal level and the third signal 504 remains at the high signal level. As a consequence, the signal level of the output signal 600 falls to the lowest signal level 602. In the case of 360° or zero degrees, this sequence starts afresh. As a result of the six signal levels 602, 604, 606, 608, 610, 612, each angular region of a full rotation of the magnetic field is assigned a defined signal level or value of the output signal 600, which signal level can be clearly determined.

Within the six switching states during an electrical rotation of the machine, at least one Hall input is always at the ground potential and at least one additional input is always at Hall signal supply potential. As a consequence, as a result of the different resistor circuitry for the three Hall paths 500, 502, 504, the voltage divider is a voltage divider whose division ratio differs for all six bit pattern states within an electrical rotation. As a consequence, six discrete voltage levels 602, 604, 606, 608, 610, 612 are generated as a result of supplying the Hall signals using the Hall signal sensor supply, which voltage levels are clearly assigned to the respective Hall signal bit pattern and consequently to the position of the rotor within an electrical rotation.

In the case of the disclosed layout of the divider resistors R5, R15=2*R5 and R25=4*R5, an optimal distribution of the available voltage range occurs. The exact voltage value for each switching state of the reduced Hall signals can be combined to form an expected progression 600.

In the case of a system where low demands are placed on the commutation accuracy (time offset from a Hall edge until the actual commutation), the interrupt processing of the Hall signals 500, 502, 504 by means of three digital inputs can be omitted and can be replaced by way of only one analogue input having corresponding high frequency scanning. As a consequence, it is possible to use simpler and more cost-effective computer derivatives.

In addition to the option of the commutation process, additional malfunction events can be diagnosed by way of this analogue input. By way of example, an overvoltage/undervoltage of the Hall sensor supply can be detected. Discrete voltage levels would then be outside of the plausible range. Implausible Hall signals, for example signals that are three times as high or three times as low, can likewise be detected, since the voltage level 600 would then be present constant at the sensor supply level or the ground potential. Furthermore, a failure of a Hall sensor as a result of, for example, a short-circuit to ground or the sensor supply voltage can be detected. One of the discrete voltage values 602, 604, 606, 608, 610, 612 would be located within an electrical rotation at ground or sensor supply level. The different signal levels can be easily verified by means of an oscilloscope measurement.

The position determination process that is disclosed can be used in all systems in which the position of the rotor of electrical machines is determined by means of digital Hall signals. It is not crucial whether the motor is an EC motor or DC motor. In the case of higher resolution systems, such as for example when using five Hall sensors, by means of which an electrical resolution of 36° can be achieved, it is possible to correspondingly expand the diagnosis circuitry and likewise the use of said circuitry. In the case of a five-fold Hall system, the ratio of the divider resistors with respect to one another would be R5, R15=2*R5, R25=3*R5, R35=6*R5 and R45=6*R5.

The exemplary embodiments that are described and are illustrated in the figures are selected only as examples. Different exemplary embodiments can be stand-alone or can be combined with one another in relation to individual features. An exemplary embodiment can also be supplemented by means of features of a further exemplary embodiment.

In addition, method steps in accordance with the disclosure can be repeated and also performed in a sequence that is different to the described sequence.

One exemplary embodiment comprises an "AND/OR"-operation between a first feature and a second feature, in other words the exemplary embodiment in accordance with an embodiment comprises both the first feature and also the second feature and in accordance with a further embodiment comprises either only the first feature or only the second feature.

What is claimed is:

1. A device for monitoring signal levels of signals that are generated, for the purpose of detecting a magnetic field, by a plurality of Hall sensors, comprising:
   a first input for a first signal from a first Hall sensor of the plurality of Hall sensors, wherein a first electrical resistor includes a first terminal connected directly to the first input and a second terminal connected directly to a central point;
   a second input for a second signal from a second Hall sensor of the plurality of Hall sensors, wherein a second electrical resistor includes a first terminal connected directly to the second input and a second terminal connected directly to the central point;
   a third input for a third signal from a third Hall sensor of the plurality of Hall sensors, wherein a third electrical resistor includes a first terminal connected directly to the third input and a second terminal connected directly to the central point, wherein a resistance level of the second resistor is double a resistance level of the first resistor and a resistance level of the third resistor is quadruple the resistance level of the first resistor; and
   a diagnostic device that is connected to the central point and configured to determine a position and/or an orientation of the detected magnetic field using an average value that results from the first signal, second signal, and third signal.

2. The device according to claim 1, wherein the diagnostic device is further configured to detect an electrical malfunction of the Hall sensors of the plurality of Hall sensors if the average value deviates by more than a tolerance range of an expected average value or a progression of the average value.

3. A method for monitoring signal levels of signals that are generated, for the purpose of detecting a magnetic field, by a plurality of Hall sensors, comprising:

receiving a first signal from a first Hall sensor of the plurality of Hall sensors at a central point through a first electrical resistor, wherein the first electrical resistor includes a first terminal connected directly to the first input and a second terminal connected directly to the central point, the first resistor applying a first level of resistance to the first signal;

receiving a second signal from a second Hall sensor of the plurality of Hall sensors at the central point through a second electrical resistor, wherein the second electrical resistor includes a first terminal connected directly to the second input and a second terminal connected directly to the central point, the second resistor applying a second level of resistance to the second signal, the second level of resistance being double the first level of resistance;

receiving a third signal from a third Hall sensor of the plurality of Hall sensors at the central point through a third electrical resistor, wherein the third electrical resistor includes a first terminal connected directly to the third input and a second terminal connected directly to the central point, the third resistor applying a third level of resistance to the second signal, the third level of resistance being quadruple the first level of resistance; and detecting an electrical malfunction of the Hall sensors of the plurality of Hall sensors and/or determining a position and/or an orientation of the detected magnetic field based on an average of the first signal, the second signal, and the third signal measured at the central point.

* * * * *